United States Patent [19]

Nishihara

[11] Patent Number: 5,424,235
[45] Date of Patent: Jun. 13, 1995

[54] SEMICONDUCTOR MEMORY DEVICE

[75] Inventor: Toshiyuki Nishihara, Kanagawa, Japan

[73] Assignee: Sony Corporation, Tokyo, Japan

[21] Appl. No.: 306,434

[22] Filed: Sep. 19, 1994

Related U.S. Application Data

[60] Division of Ser. No. 57,207, Apr. 14, 1993, abandoned, which is a continuation of Ser. No. 757,301, Sep. 10, 1991, abandoned.

[30] Foreign Application Priority Data

Sep. 10, 1990 [JP] Japan ................................. 2-239418
Dec. 26, 1990 [JP] Japan ................................. 2-414488

[51] Int. Cl.6 ........................................ H01L 21/8242
[52] U.S. Cl. ........................................ 437/52; 437/47; 437/60; 437/919
[58] Field of Search ................ 357/23.5, 23.7; 257/298, 299, 300, 303, 304, 305, 306, 311, 318, 319, 320, 322, 390, 393, 295, 296, 297, 308, 309, 310, 312, 313; 437/47, 48, 52, 60, 89, 162, 919

[56] References Cited

U.S. PATENT DOCUMENTS

| | | |
|---|---|---|
| 3,755,012 | 8/1973 | George et al. |
| 4,501,060 | 2/1985 | Frye et al. |
| 4,763,180 | 8/1988 | Hwang et al. ........................ 437/52 |
| 4,786,954 | 11/1988 | Morie et al. ........................ 257/303 |
| 4,969,022 | 11/1990 | Nishimoto et al. ................. 257/311 |
| 4,970,564 | 11/1990 | Kimura et al. ...................... 257/306 |
| 5,013,676 | 5/1991 | Horigome ............................. 437/52 |
| 5,102,819 | 4/1992 | Matsushita et al. ................. 437/47 |
| 5,192,704 | 3/1993 | McDavid et al. .................... 437/60 |

FOREIGN PATENT DOCUMENTS

| | | |
|---|---|---|
| 0352664 | 1/1990 | European Pat. Off. |
| 0356218 | 2/1990 | European Pat. Off. |
| 149452 | 6/1989 | Japan . |

OTHER PUBLICATIONS

Article "A 1.5-V Dram for Battery-Based Applications", 24 (1989) Oct., No. 5, IEEE Journal of Solid State Circuits, vol. 24 Oct. 1989.
Patent Abstract of Japan Publication No. 01 149452.
Japanese Abstract vol. 13, No. 554 (E–855) [3892] Dec. 6, 1989.
Japanese Abstract vol. 13, No. 280 (E–779) [3628] Jun. 17, 1989.

*Primary Examiner*—Tom Thomas
*Attorney, Agent, or Firm*—Hill, Steadman & Simpson

[57] ABSTRACT

A semiconductor memory device where memory cells are formed on one surface of a semiconductor layer, and bit lines are formed on the other surface thereof. The bit lines are connected electrically to the memory cells and are formed under the semiconductor layer with a bit-line shielding conductor interposed between the bit lines via an insulating layer, and a bit-line shielding voltage is supplied from the reverse side of the substrate to the bit-line shielding conductor.

2 Claims, 15 Drawing Sheets

F I G. 2
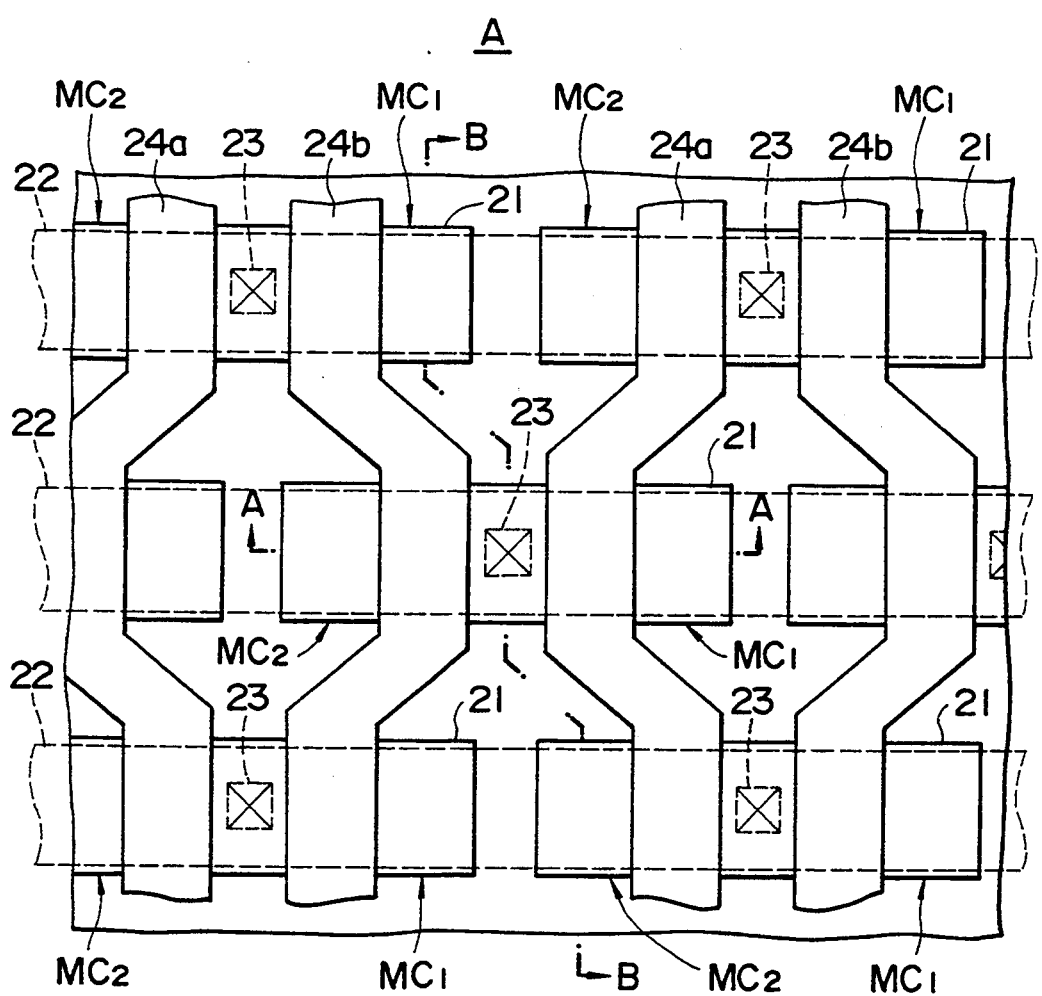

SEMICONDUCTOR MEMORY DEVICE

CROSS-REFERENCE TO RELATED APPLICATIONS

This is a division of application Ser. No. 08/057,207, filed Apr. 14, 1993, now abandoned, which is a continuation of Ser. No. 07/757,301, filed Sep. 10, 1991, now abandoned. This application relates to the subject matter such as disclosed in application Ser. No. 627,600 filed Dec. 14, 1990 entitled "Semiconductor Memory" assigned to the assignee of the present application. This application is also related to application Ser. No. 07/805,967 filed Dec. 12, 1991, now abandoned, entitled "Dynamic Random Access Memory Fabricated Wit SOI Substrate", in which the inventor is Toshiyuki Nishihara assigned to the assignee of the present application.

BACKGROUND OF THE INVENTION

1. Field of the Invention

The present invention relates to a semiconductor memory device for transferring data via bit lines to write the data in a memory cell or to read out the same therefrom, such as a DRAM (dynamic random access memory) where a memory cell is provided in an element forming region on a silicon substrate or the like.

2. Description of the Prior Art

With the recent technical development toward higher density integration of semiconductor memory devices such as DRAMs, there is noticed of late the practical employment of a stacked capacitor type where the structure for storing data is formed into a stacked constitution to ensure a sufficient storage capacity. And a cell array of an open bit line system is also attracting considerable attention due to a high efficiency in reduction of the cell area and integration of the memory device itself.

In a conventional semiconductor memory device of stacked capacity type having a known open bit line structure, as shown in FIG. 1, impurity-diffused regions of switching elements Tr are formed on the surface of a silicon substrate 2 where a field insulating layer 1 is deposited, and a bit line 5 composed of an aluminum wiring layer is connected via a contact hole 4 to one source-drain region 3a of the impurity-diffused regaions, while a lower electrode 6 of each of stacked capacitors C is connected to another source-drain region 3b.

The lower electrode 6 of the capacitor is formed by patterning a second polycrystal silicon layer in a manner to reach, via an interlayer insulating film 8, an upper portion of a gate electrode (word line) 7 of the switching element Tr composed of a first polycrystal silicon layer. The capacitor lower electrode 6 has thereabove a capacitor upper electrode 9, which serves as a common electrode, via a dielectric film 10. And the stacked capacitor C is constituted of such stacked structure which comprises the capacitor upper electrode 9, the dielectric film 10 and the capacitor lower electrode 6. In this known example, one memory cell MC is composed of the switching element Tr and the stacked capacitor C formed on the silicon substrate 2.

In such semiconductor memory device, a required charge is stored in the stacked capacitor C, and data is read out from or written in the memory device via the bit line 5 under control by the switching element Tr. There is further shown a shunting (backing) metal wire 11 for reducing the resistance of the word line 7. Denoted by 12 is an interlayer insulating film of silicon dioxide or the like.

However, in such conventional semiconductor memory device, the following problems arise as a result of the technical progress toward higher density integration.

First, due to the necessity of achieving contact between the upper-layer bit line 5 and the source-drain region 3a, the capacitor lower electrode 6 and the capacitor upper electrode 9 constituting the stacked capacitor C need to be spaced apart from the contact portion between the bit line 5 and the silicon substrate 2. Accordingly there arises a disadvantage in that the capacitor-occupied portion in the memory cell MC is crowded which consequently causes difficulties in ensuring a sufficient capacity.

In addition, since the bit line 5 is existent in a state sandwiched between the capacitor upper electrode 9 and the metal wire 11, the bit line 5 interferes with the capacitor upper electrode 9 and the word line 7 at the charging or discharging time to thereby cause interference noise. And also when the voltage applied to the word line 7 is turned to a high level, there occurs interference noise in the bit line 5. Such interference noise is generated in regard to the bit line 5 which deteriorates the data, and the resultant disadvantage is conspicuous particularly in using the open bit line structure concerned with the subject of the present invention.

Further in the conventional semiconductor memory device, the distance m between the shunting metal wire, 11 and the silicon substrate 2 is increased since a plurality of wiring layers are sequentially superposed on the silicon substrate 2. Generally the shunting metal wire 11 is used also for connection to a peripheral circuit and so forth, and when the distance m between the metal wire 11 and the silicon substrate 2 is increased as described above, it becomes difficult in the peripheral circuit to attain a low-resistance contact between the metal wire 11 and the silicon substrate 2, hence deteriorating the irregularity covering facility for the metal wire 11.

Thus, it is necessary to realize a large-capacitance stacked capacitor in the open bit line structure while suppressing the inteference noise between the wiring layers so as to promote higher density integration of the memory devices.

OBJECTS AND SUMMARY OF THE INVENTION

It is a first object of the present invention to provide an improved semiconductor memory device with memory cells formed in a semiconductor layer on a substrate, wherein bit lines connected electrically to the memory cells are formed under the semiconductor layer with a bit-line shielding conductor interposed between the bit lines via an insulating layer, and a bit-line shielding voltage is supplied from the reverse side of the substrate to the bit-line shielding conductor.

A second object of the present invention is to provide an improved memory device with bit lines positioned under a semiconductor layer where switching elements are formed. In this structure, there is no possibility of short-circuiting between word lines of memory cells and bit-line contact portions to consequently eliminate the necessity of any positioning allowance therebetween, hence reducing the areas of the memory cells correspondingly to such allowance.

A third object of the present invention resides in providing an improved memory device where bit-line contact portions need not be avoided in forming stacked capacitors. In this structure, the capacities of memory cells can be rendered greater by increasing the areas occupied by the stacked capacitors in the memory cells, so that desired cell capacities can be ensured despite dimensional reduction of the memory cell areas.

A fourth object of the present invention is to provide an improved memory device where the step coverage and so forth for the upper portions of memory cells are not harmfully affected by any increase of the distance between the bit line and the word line so that such increase can be achieved. Due to the nonexistence of any bit line above the memory cells, it becomes possible to diminish the interference noise caused from the bit lines to both the word lines and the stacked capacitors, and further to decrease the parasitic capacitance and the interference noise from the bit lines based on the potential states of the word lines.

A fifth object of the present invention resides in providing an improved memory device where a bit-line shielding conductor is interposed between bit lines so as to suppress the interference noise between the bit lines, thereby preventing deterioration of the data.

A sixth object of the present invention is to provide an improved memory device where none of bit lines is formed above memory cells so that the distance between a metal wire for each memory cell and a silicon substrate can be reduced by a length corresponding to the thickness of an interlayer insulating film formed between the bit line and the metal wire, thereby promoting reduction of the resistance in the connection of the metal wire to any peripheral circuit, and further enhancing the irregularity covering facility relative to the metal wire.

And a seventh object of the present invention is to provide an improved method of manufacturing a semiconductor memory device where a semiconductor layer is interposed between memory cells and bit lines, and the distance between the word lines of the memory cells and bit lines thereof is lengthened, and the memory cells and the bit lines are positioned on mutually reverse sides of a semiconductor layer.

The above and other objects, features and advantages of the present invention will become apparent from the following description which will be given with reference to the illustrative accompanying drawings.

BRIEF DESCRIPTION OF THE DRAWINGS

FIG. 2 is a plan view of principal components in a semiconductor memory device embodying the present invention;

DESCRIPTION OF THE PREFERRED EMBODIMENTS

Hereinafter first and second embodiments of the present invention will be described in detail with reference to FIGS. 2 through 12.

Figure 1:
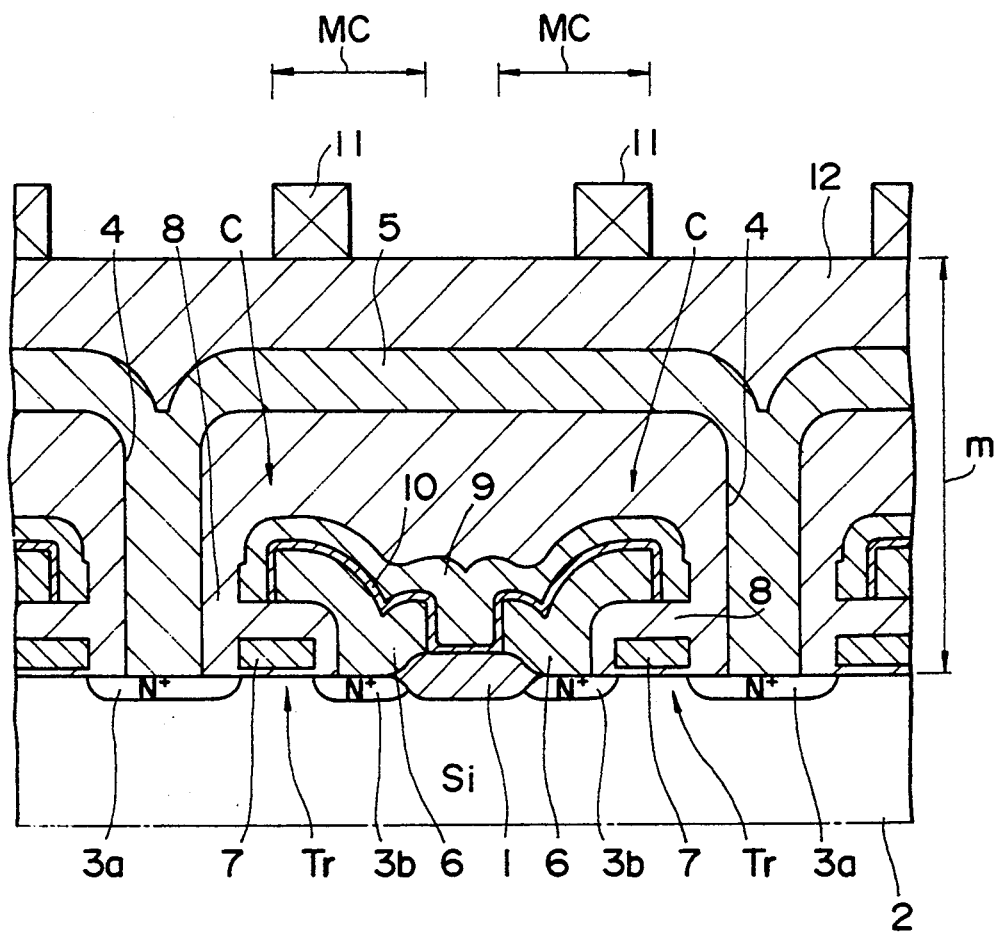
FIG. 1 is a sectional view showing the structure of a conventional semiconductor DRAM.
Figure 3:
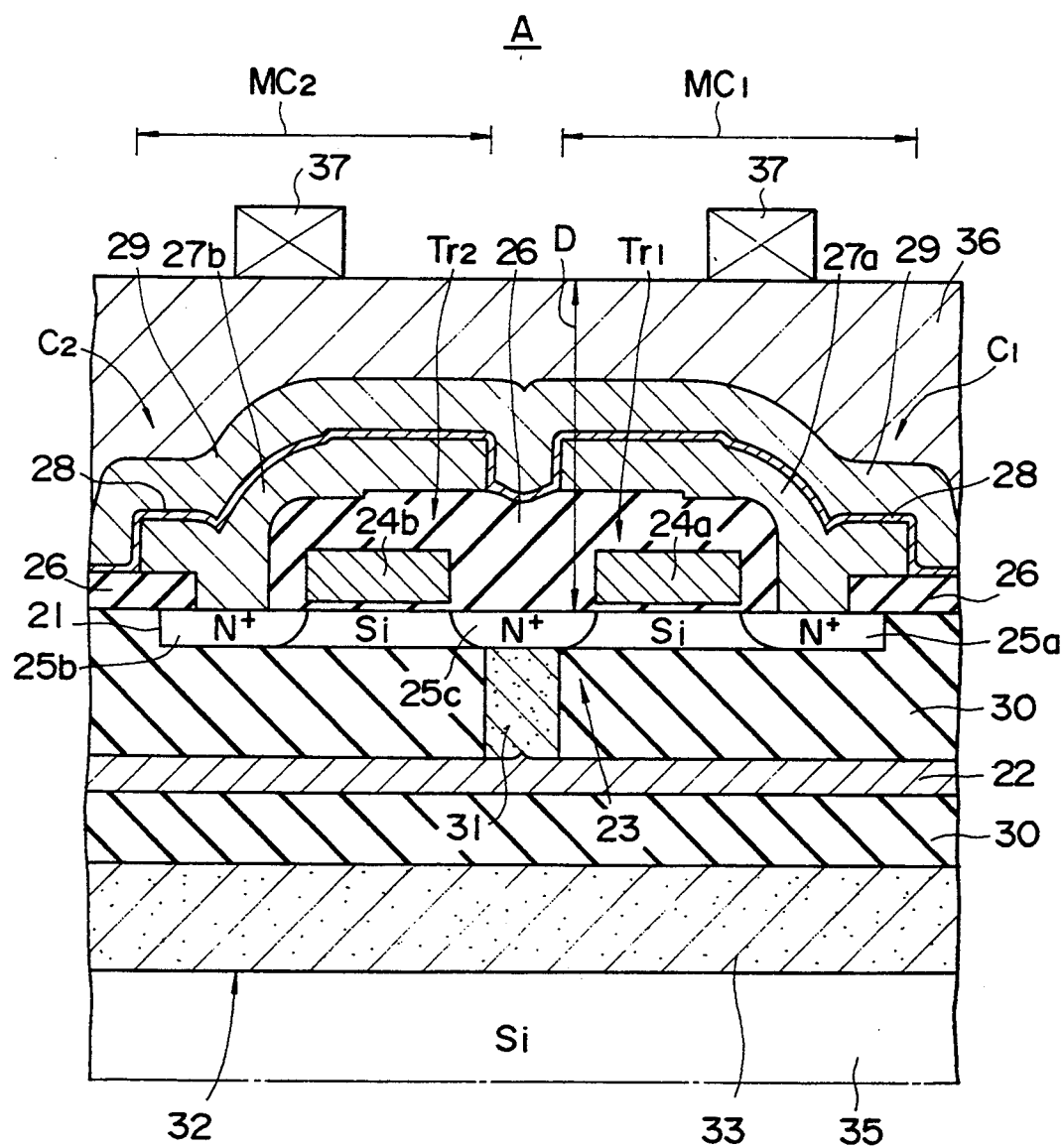
FIG. 3 is a sectional view taken along the line A—A in FIG. 2 of the present invention.
Figure 4:
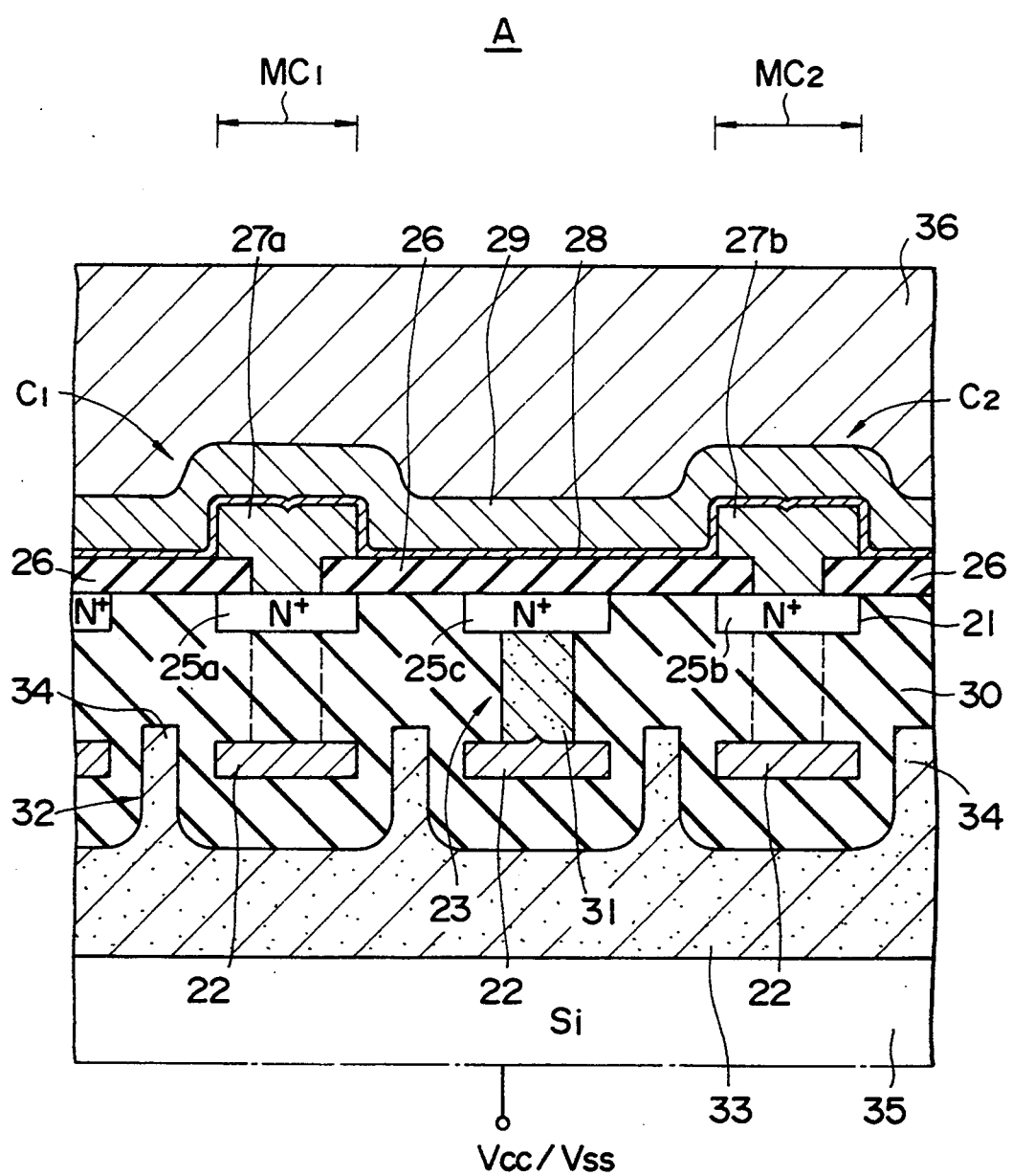
FIG. 4 is a sectional view taken along the line B—B in FIG. 2 of the present invention.

FIG. 2 is a plan view of principal components in a semiconductor memory device A embodying the present invention, particularly in an exemplary DRAM; FIG. 3 is a sectional view taken along the line A—A in FIG. 1; and FIG. 4 is a sectional view taken along the line B—B in FIG. 1.

The memory device A is so composed that, as shown in FIG. 2, two vertical word lines 24a and 24b are formed on the left and right sides of contact portions 23 relative to transverse bit lines 22 (represented by broken lines) at the centers of element forming regions 21 enclosed with an insulating layer of silicon dioxide or the like. A switching element Tr1 is composed of one word line 24a, an N-type source-drain region 25c in the contact portion 23, and an N-type source-drain region 25a on the right of the word line 24a as shown in FIG. 3; and one electrode of a polycrystal silicon layer serving as a storage node hereinafter), referred to as a storage node electrode 27a is formed on the switching element Tr1 via an insulating layer 26. The storage node electrode 27a and the source-drain region 25a are electrically connected to each other. Meanwhile a storage node electrode 27b is formed via the insulating layer 26 on a switching element Tr2 which is composed of the other word line 24b, a source-drain region 25c in the contact portion 23, and the other N-type source-drain region 25b on the left of the word line 24b in the drawing. The storage node electrode 27b and the source-drain region 25b are electrically connected to each other.

A common cell plate electrode 29 of a polycrystal silicon layer is formed via a thin dielectric film 28 of silicon dioxide ($SiO_2$) or silicon nitride (SIN) on an upper surface including the storage node electrodes 27a and 27b. And such cell plate electrode 29, dielectric film 28 and storage node electrodes 27a, 27b constitute stacked capacitors C1 and C2 respectively.

Two memory cells MC1 and MC2 are composed of the switching elements Tr1, Tr2 and the stacked capacitors C1, C2, respectively. As shown in FIG. 2, the memory cells MC1 and MC2 are formed at all intersections of the word lines 24a, 24b and the bit lines 22 in a state where the array thereof conforms with the so-called open bit line system.

In this embodiment, as shown in FIG. 3, the bit lines 22 are existent under the element forming region 21 via an insulating layer 30, and the bit line 22 and the source-drain region 25c in the element forming region 21 are electrically connected to each other through a polycrystal silicon layer 31 formed by the poly-plug technique or the like, so that the contact portions 23 for the bit lines 22 are formed immediately below the element forming region 21. Further as shown in FIG. 4, a shield electrode 32 of a polycrystal silicon layer is formed between the bit lines 22 via the insulating layer 30 in a manner to extend along the bit lines 22. The shield electrode 32 is composed of a polycrystal silicon layer 33 formed under the insulating layer 30, and a strip electrode portion 34 projecting upward from the polycrystal silicon layer 33 toward the insulating layer 30 between the bit lines 22. And the shield electrode 32 is electrically fixed by a potential Vcc or Vss supplied from the reverse side of the silicon substrate 35 immediately below the polycrystal silicon layer 33.

Now an exemplary method of manufacturing the semiconductor memory device A in this embodiment will be described below with reference to FIGS. 5A through 12, wherein the same reference numerals as those used in FIGS. 2 and 3 denote the same or corresponding components.

The process steps shown in FIGS. 5A through 8 are relative to the section viewed from the same direction as that in FIG. 4, and the process steps shown in FIGS. 9A through 12 are relative to the section viewed from the same direction as that in FIG. 3. The manufacturing method will be described sequentially with reference to FIGS. 5A through 8 and FIGS. 9A through 12 in parallel.

Figure 5A:
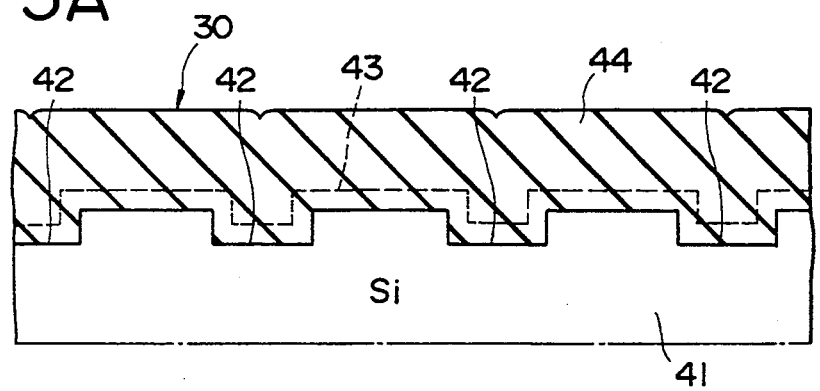
FIGS. 5A through 5C show a first stage of process steps in manufacturing the semiconductor memory device of the present invention as viewed from the same sectional direction as that in FIG. 4.
Figure 9A:
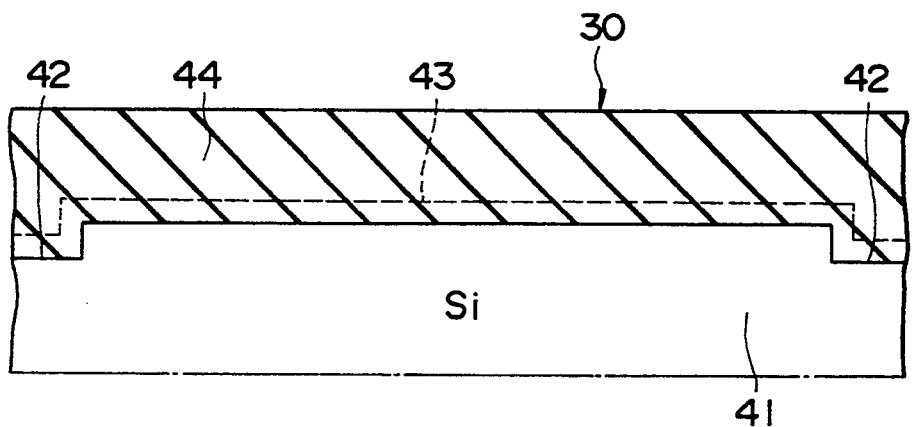
FIGS. 9A and 9B show a first stage of process steps in manufacturing the semiconductor memory device of the present invention as viewed from the same sectional direction as that in FIG. 3.

First, as shown in FIGS. 5A and 9A, predetermined surface portions of a silicon substrate 41, i.e., element isolating regions in this embodiment, are selectively removed by etching to a depth of 2000 angstroms or so to thereby form recesses 42, and then the entire surface is thermally oxidized to form an oxide film 43 (corresponding to the thickness from the silicon surface to a broken line on the drawing). Thereafter an insulating layer 44 of silicon dioxide is formed by the chemical vapor deposition (CVD) or the like. Hereinafter both the oxide film 43 and the insulating layer 44 will be simply referred to as an insulating layer 30.

Figure 5B:
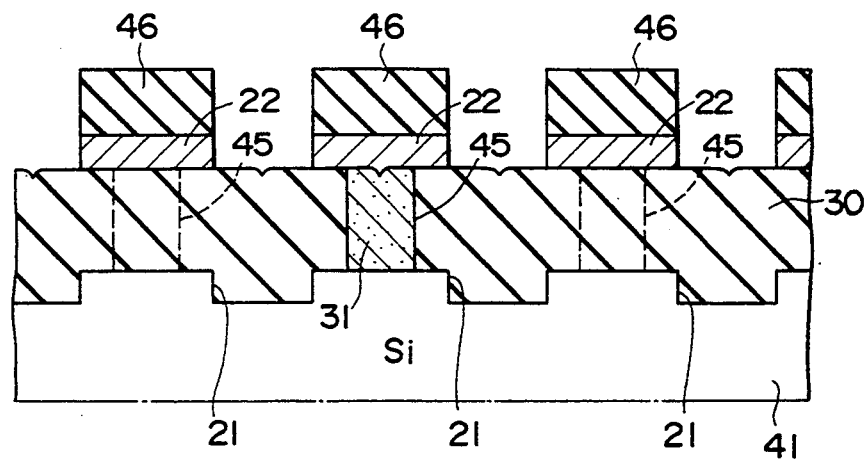
Figure 9B:
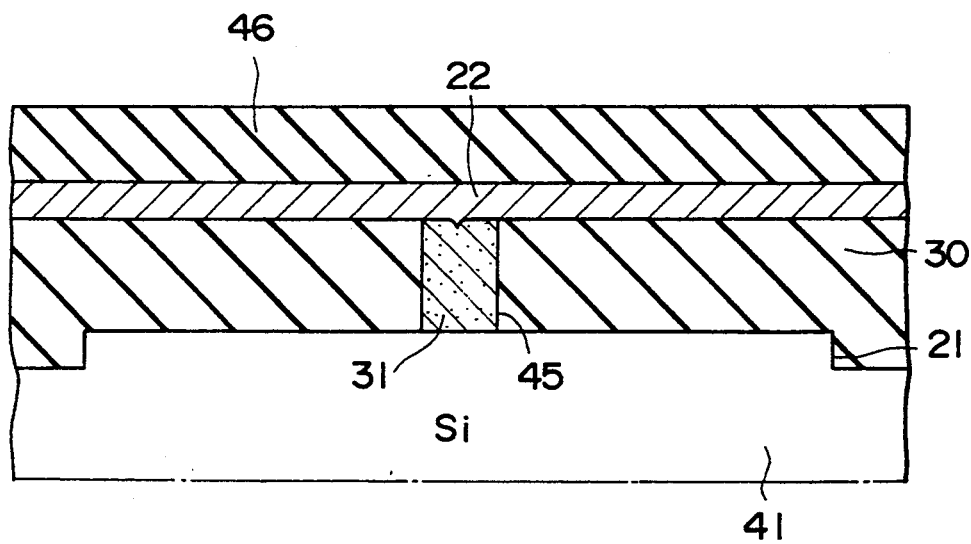

In a next process step, as shown in FIGS. 5B and 9B, apertures 45 piercing through the insulating layer 30 are formed one by one at the centers of individual portions which serve as element forming regions 21 on the silicon substrate 41. Thereafter a polycrystal silicon layer 31 is formed by the CVD on the entire surface to fill such apertures 45, and then is etched back to plug the polycrystal silicon layer 31 into the apertures 45 by the poly-plug technique. Subsequently a tungsten polyside layer for bit lines and an insulating layer 46 of silicon dioxide are sequentially deposited on the entire surface and then are cut by the use of a single mask, so that the tungsten polyside layers and the insulator layers 46 are left on the polycrystal silicon layer 31 plugged into the apertures 45. In this stage, the tungsten polyside layers become bit lines 22.

Figure 5C:
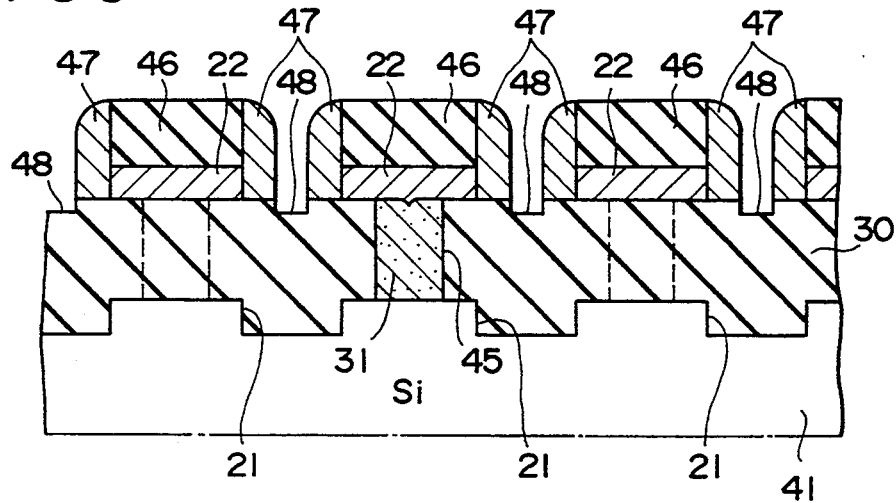

Thereafter, as shown in FIG. 5C, a silicon dixide film is formed on the entire surface and then is etched back to shape silicon dioxide films 47 on the side walls of the bit lines 22, whereby side walls 47 are formed. In this step, the above etch-back is so executed as to cause a slightly over-etched state to form recesses 48 in the upper surface of the insulating layer 30.

Figure 6A:
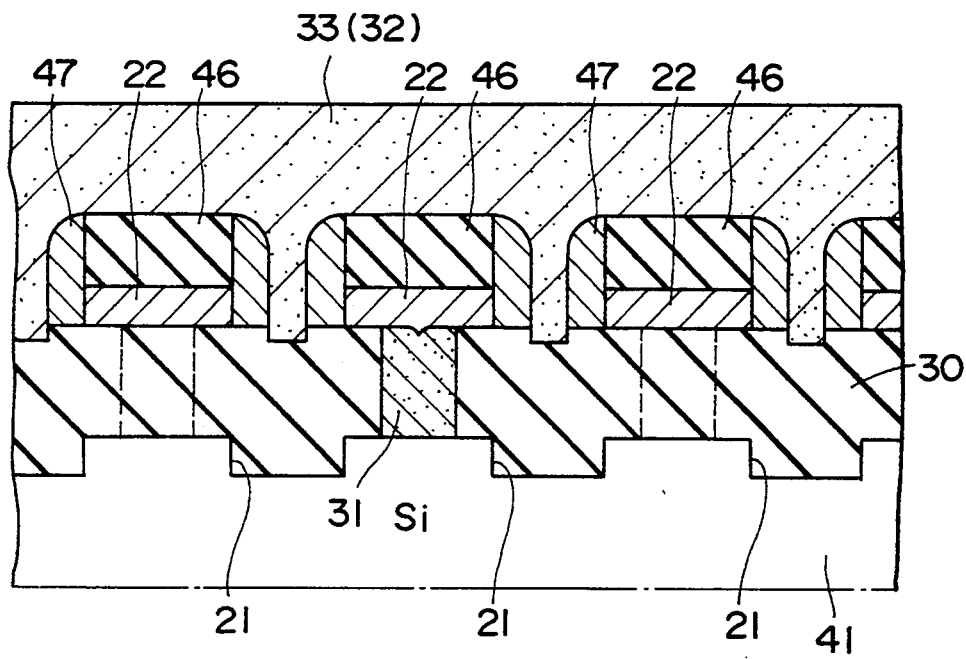
FIGS. 6A and 6B show a second stage of process steps in manufacturing the semiconductor memory device of the present invention as viewed from the same sectional direction as that in FIG. 4.
Figure 10A:
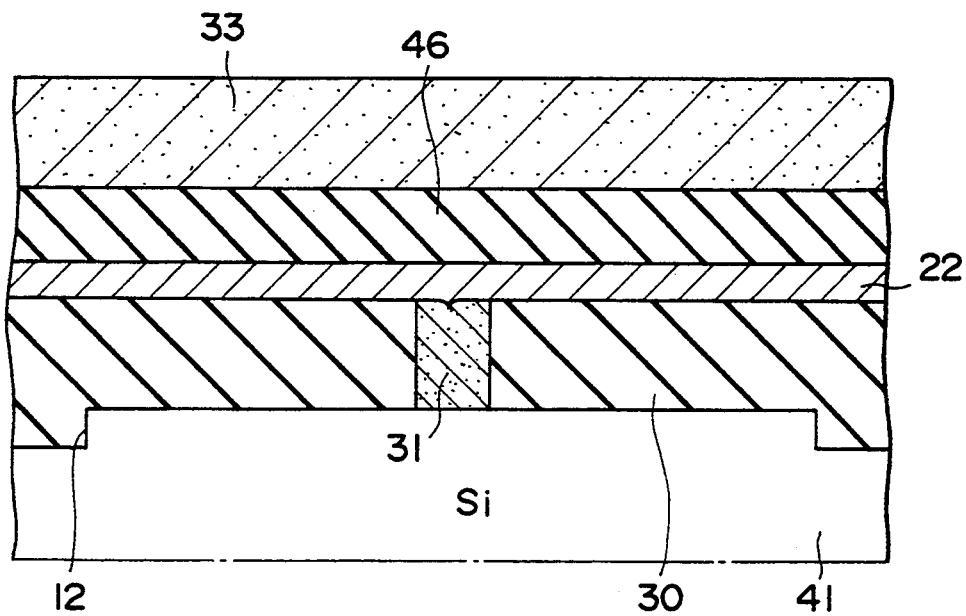
FIGS. 10A and 10B show a second stage of process steps in manufacturing the semiconductor memory device of the present invention as viewed from the same sectional direction as that in FIG. 3.

Subsequently, as shown in FIGS. 6A and 10A, a polycrystal silicon layer 33 is deposited on the entire surface, and the surface of such polycrystal silicon layer 33 is finished to be flat by the known art of polishing or the like. The polycrystal silicon layer 33 is deposited also between the side walls 47 of the bit lines 22 to thereby form shield electrodes 32 which suppress interference noise between the bit lines 22 shown in FIG. 4.

Figure 6B:
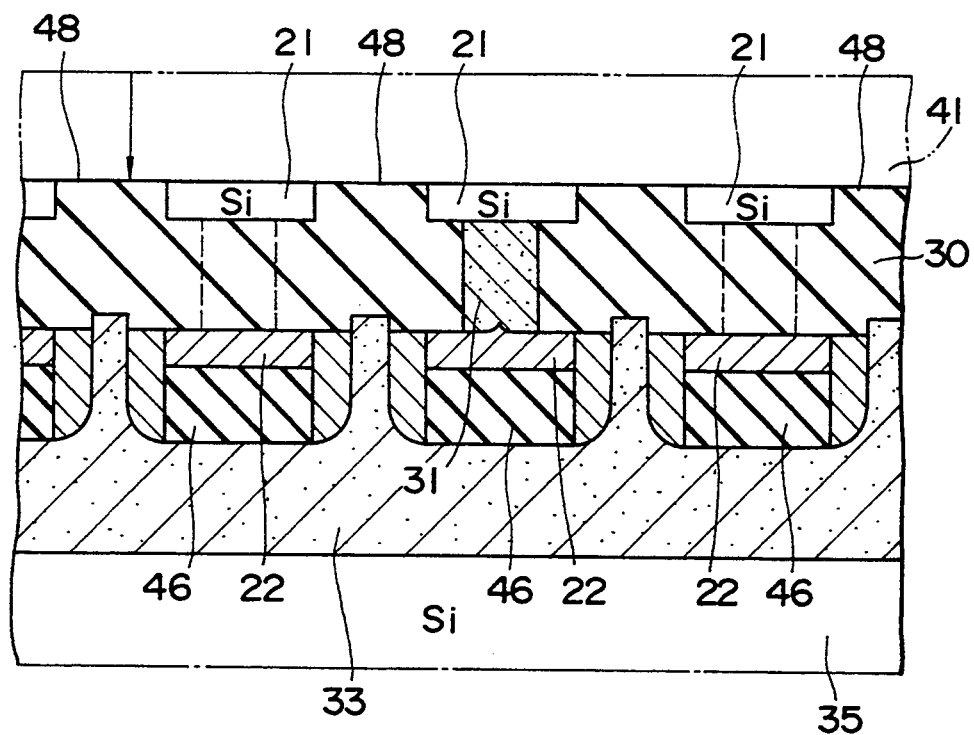
Figure 10B:
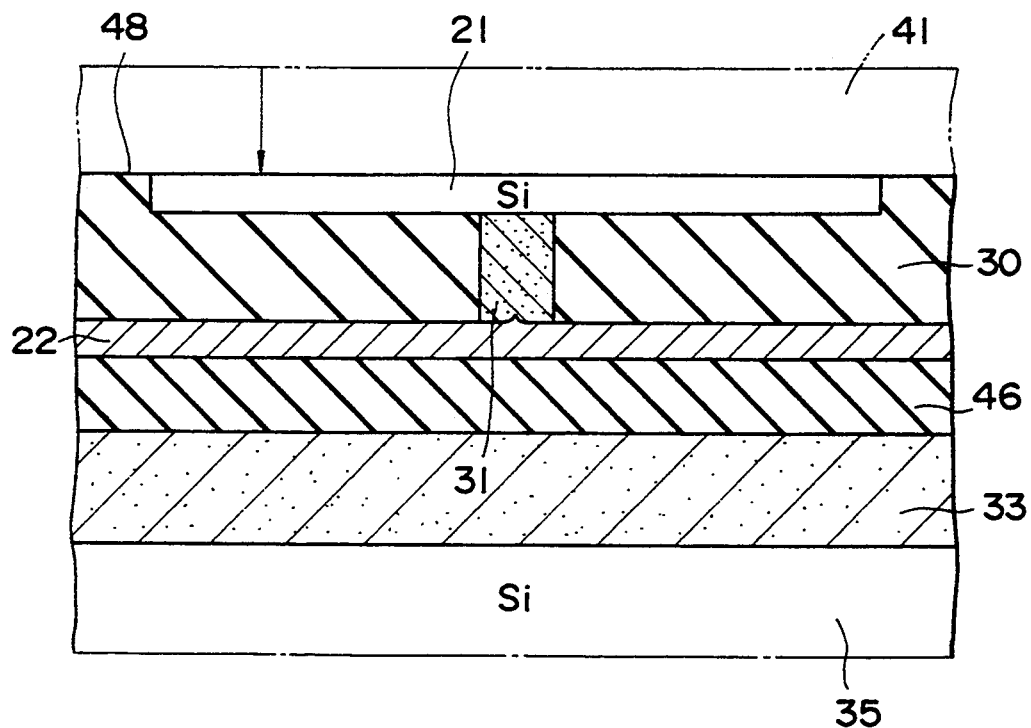

In the next step, as shown in FIGS. 6B and 10B, a silicon substrate 35 is bonded to the end face of the flattened polycrystal silicon layer 33, and then selective polishing is performed from the reverse surface of another silicon substrate 41. Such selective polishing is continuously executed until the insulating layer 30 is exposed. Due to the selective polishing, there are produced island thin layers of silicon element forming regions 21 enclosed with the insulating layer 30, and also element isolating regions 48 composed of the insulating layer 30.

Figure 7A:
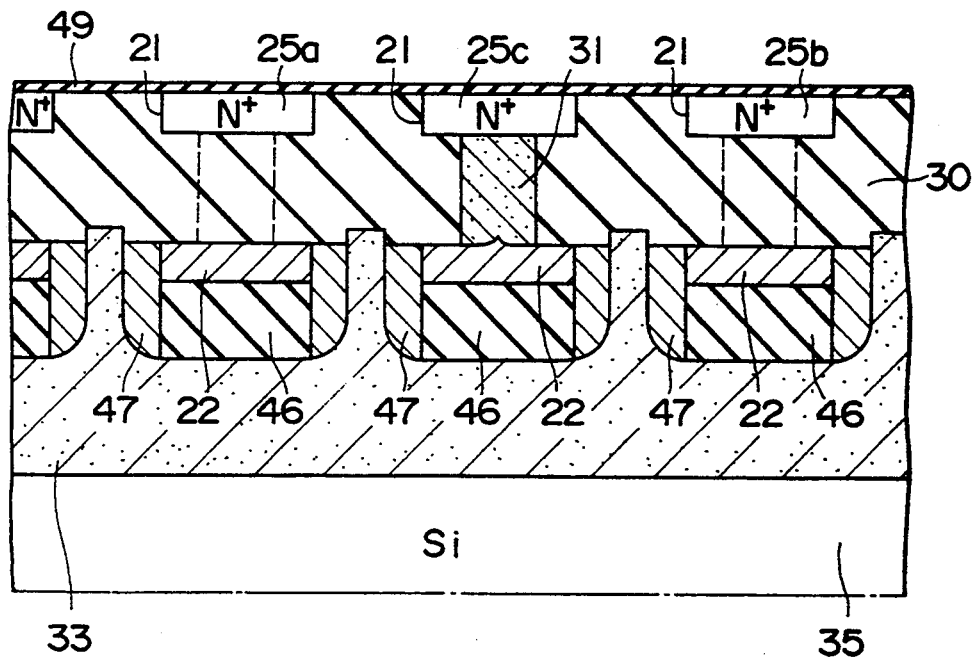
FIGS. 7A and 7B show a third stage of process steps in manufacturing the semiconductor memory device of the present invention as viewed from the same sectional direction as that in FIG. 4.
Figure 11A:
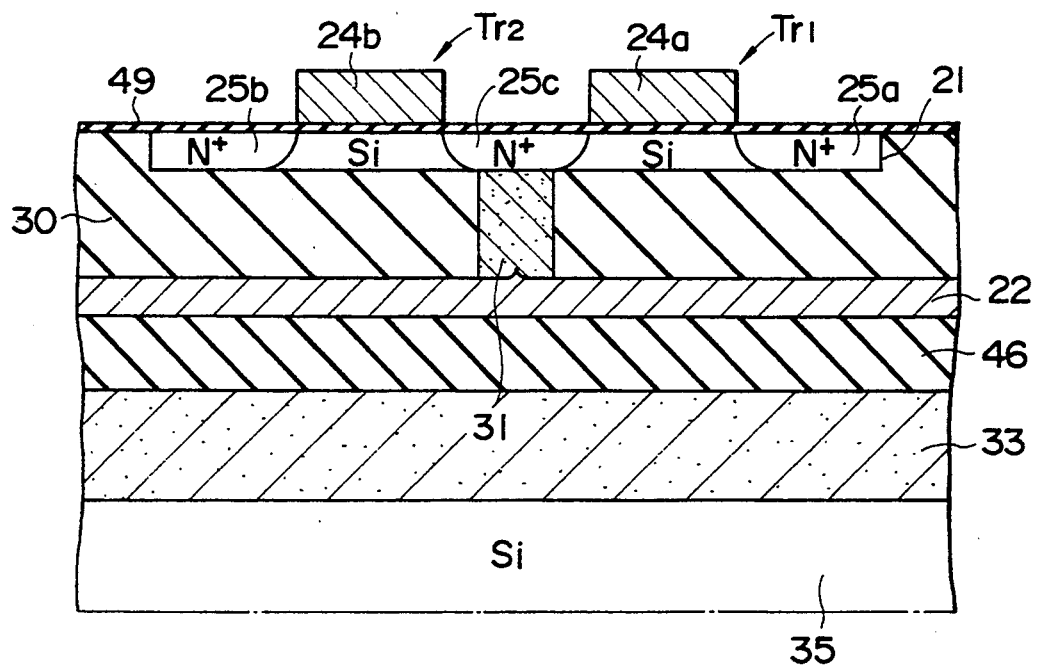
FIGS. 11A and 11B show a third stage of process steps in manufacturing the semiconductor memory device of the present invention as viewed from the same sectional direction as that in FIG. 3.

Subsequently, as shown in FIGS. 7A and 11A, the entire surface is thermally oxidized to form, on the surfaces of the element forming regions 21, a thin oxide film which serves as a gate insulating film 49, and then word lines 24a and 24b are formed by patterning the polycrystal silicon layer. Thereafter an N-type impurity is ion-implanted with the word lines 24a and 24b being masked, to thereby form three source-drain regions 25a, 25b and 25c in the element forming regions 21 respectively. In this step, switching elements Tr1 and Tr2 are produced.

Figure 7B:
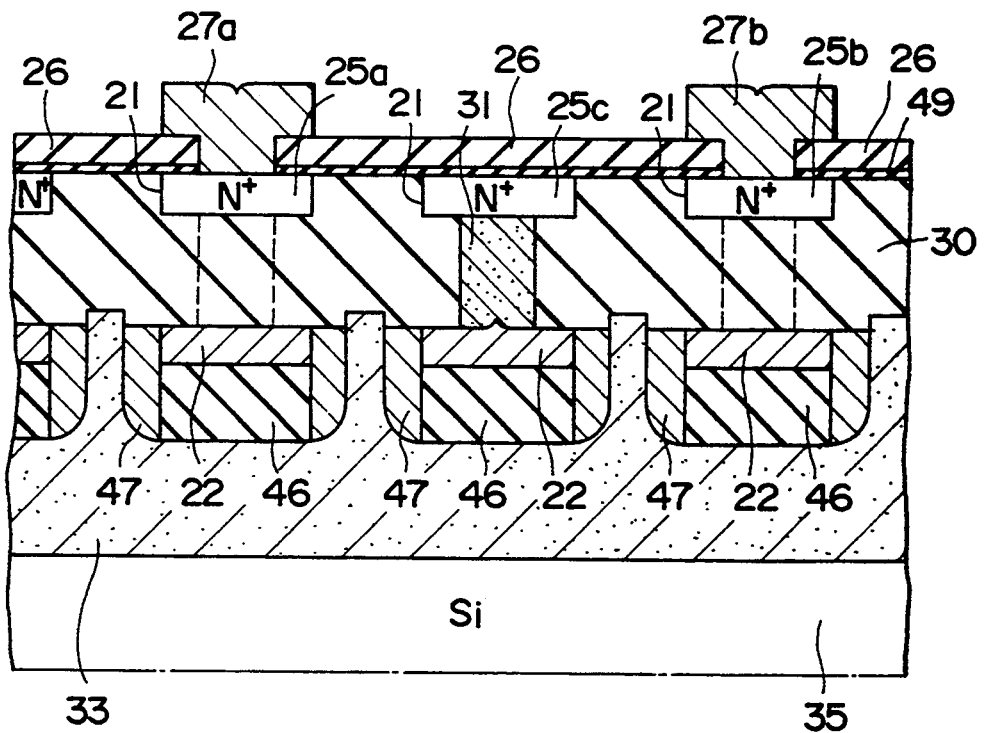
Figure 11B:
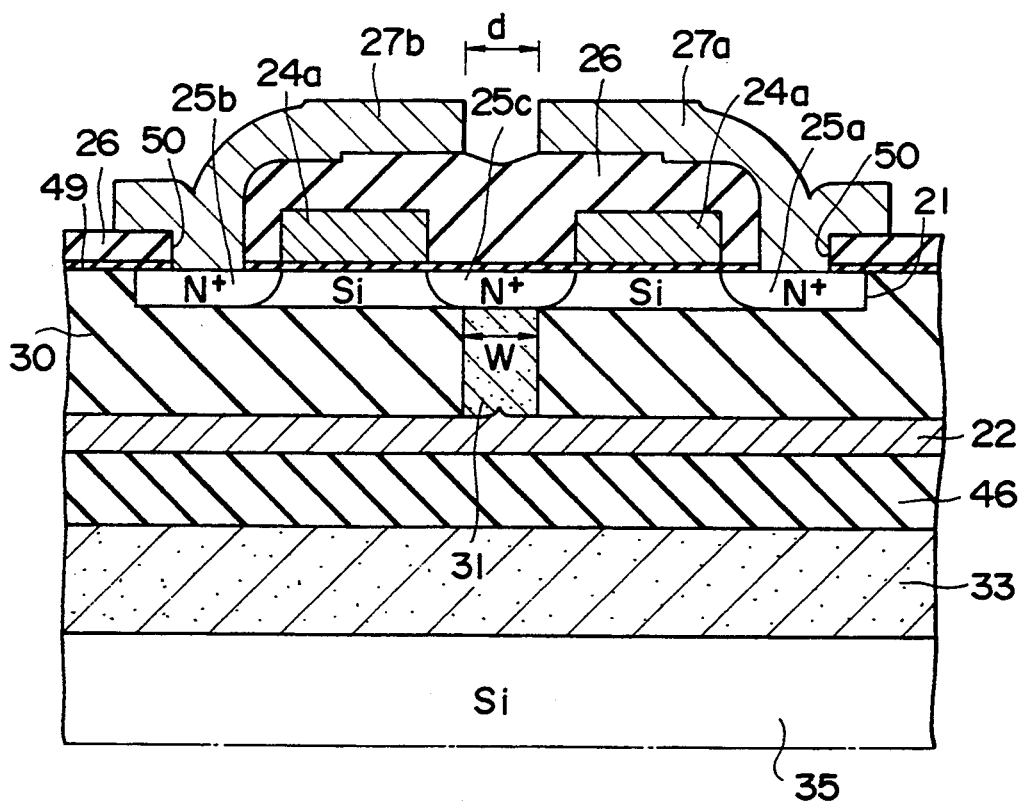

In the next step, as shown in FIGS. 7B and 11B, an insulating layer 6 of silicon dioxide or the like is formed on the entire surface, and apertures 50 piercing through the insulating layer 26 are formed at positions corresponding to the source-drain regions 25a and 25b. Thereafter a second polycrystal silicon layer is formed on the entire surface and then is patterned to produce storage node electrodes 27a and 27b. In this step, the storage node electrodes 27a and 27b are so formed that the distance d therebetween becomes relatively long to be equal to or slightly greater than the aperture width W in the contact portion 23 for the bit line 22.

Figure 8:
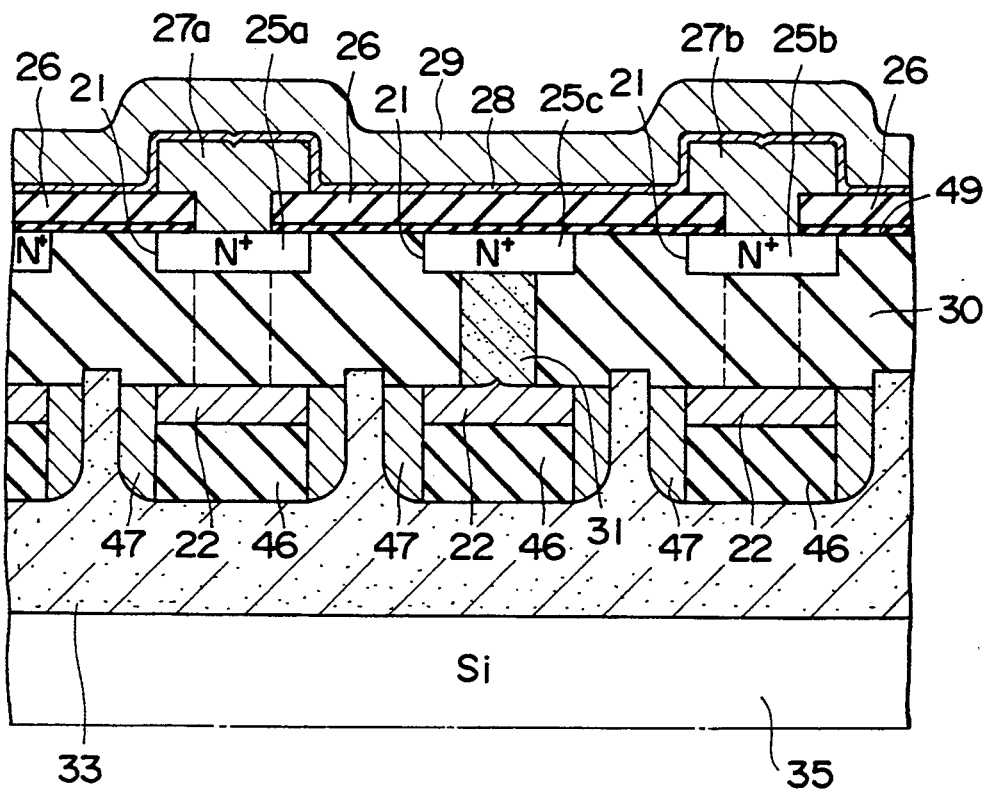
FIG. 8 shows a fourth stage of process steps in manufacturing the semiconductor memory device of the present invention as viewed from the same sectional direction as that in FIG. 4.
Figure 12:
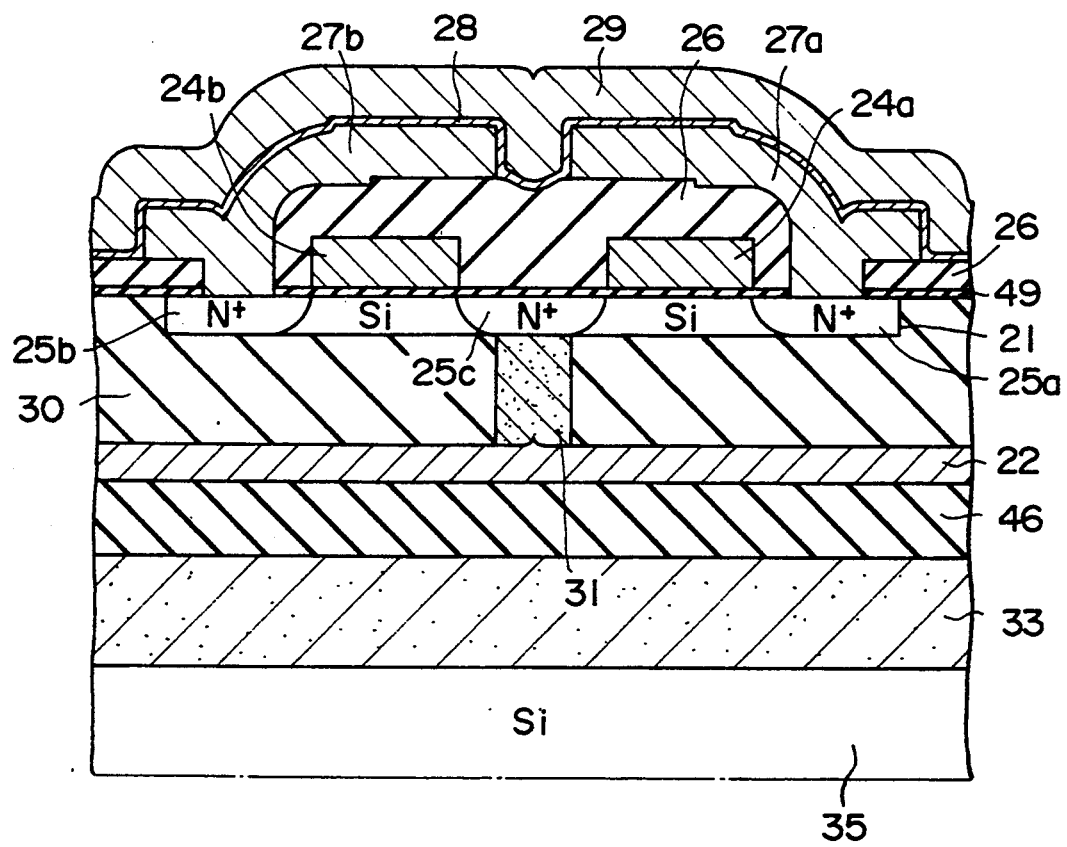
FIG. 12 shows a fourth stage of process steps in manufacturing the semiconductor memory derice of the present invention as viewed from the same sectional direction as that in FIG. 3.

Subsequently, as shown in FIGS. 8 and 12, a dielectric film 28 is formed by the decompressed CVD or the like on the entire surface inclusive of the storage node electrodes 27a and 27b, and a common cell plate electrode 29 of a polycrystal silicon layer is formed on the dielectric film 28.

And finally, as shown in FIGS. 3 and 4, an interlayer film 36 of silicon dioxide or the like is formed on the entire surface, and then metal wires 37 are formed by patterning so as to lower the resistance of the word lines 24a and 24b, whereby the semiconductor memory device A of this embodiment is manufactured. In FIGS. 3 and 4, the insulating films 30, 46 and 47 shown in FIGS. 8 and 12 are represented merely by an insulating film 30.

As described above, according to this embodiment where the bit lines 22 are provided in the element forming regions 21, there exists no possibility of short-circuiting between the bit-line contact portions 23 and the word lines 24a and 24b, so that the positioning allowance therebetween is rendered unnecessary to consequently reduce the areas of the memory cells MC1 and MC2 correspondingly to such allowance.

In forming the stacked capacitors C1 and C2, the contact portions 23 for the bit lines need not be avoided to eventually achieve an advantage of widening the areas occupied by the stacked capacitors C1 and C2 in the memory cells MC1 and MC2. It becomes therefore possible to increase the capacity of each cell to thereby ensure a desired capacity despite dimensional reduction of the memory cells MC1 and MC2.

Since none of the bit lines 22 is formed above the memory cells MC1 and MC2, the distance D (FIG. 3) between the metal wire 37 for each memory cell and the silicon substrate 35 can be reduced by a length corresponding to the thickness of the interlayer insulating film (denoted by 12 in FIG. 1) formed between the bit lines 22 and the metal wire 37, thereby promoting the reduction of the resistance in the connection of the metal wire 37 to any peripheral circuit, and further enhancing the irregularity covering facility relative to the metal wire 37.

In addition, the step coverage and so forth for the upper portions of memory cells MC1 and MC2 are not harmfully affected by any increase of the distance between the bit line 22 and the word lines 24a and 24b, so that such increase can be achieved. And due to the nonexistence of any bit line 22 above the memory cells MC1 and MC2, it becomes possible to diminish the interference noise caused from the bit lines 22 to both the word lines 24a, 24b and the stacked capacitors C1, C2, and further to decrease the interference noise from the bit lines 22 based on the potential states of the word lines 24a, 24b.

Furthermore, the bit-line shielding electrode 32 is interposed between the bit lines 22 so as to suppress the interference noise between the bit lines 22, thereby preventing deterioration of the data.

Thus, it is obvious from the above that the semiconductor memory device A of this embodiment is capable of realizing dimensional reduction of the memory cells MC1 and MC2, increase of each cell capacity, and suppression of any interference noise between the components to thereby attain a higher integration density and enhanced reliability.

Although the above embodiment represents an exemplary case of applying the present invention to a DRAM of an open bit line structure, it is a matter of course that the invention is applicable to a DRAM of a folded bit line structure as well.

Hereinafter a third embodiment of the present invention applied to a stacked capacitor type DRAM of an open bit line structure will be described in detail with reference to FIGS. 13A-13F.

FIG. 13 shows sequential process steps in manufacture of the third embodiment. First, as shown in FIG. 13A, a silicon substrate 61 is oxidized to form, on its surface, a silicon dioxide film of 1 micron or so in thickness, and recesses 82 are formed in both the silicon dioxide film 81 and the silicon substrate 61.

Figure 13A:
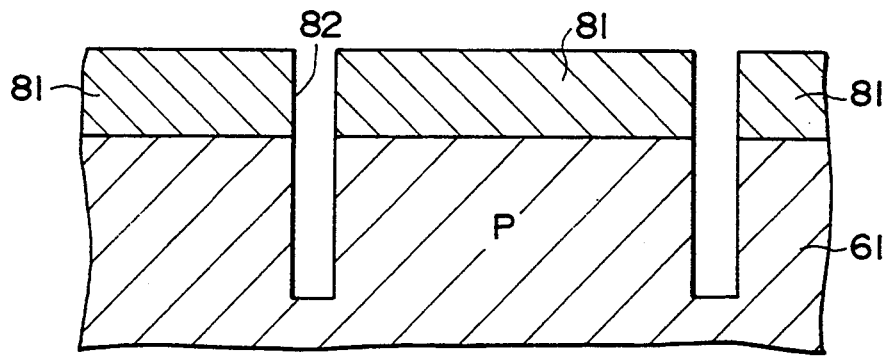
FIGS. 13A through 13F sequentially show process steps in manufacturing another embodiment of the present invention.
Figure 13B:
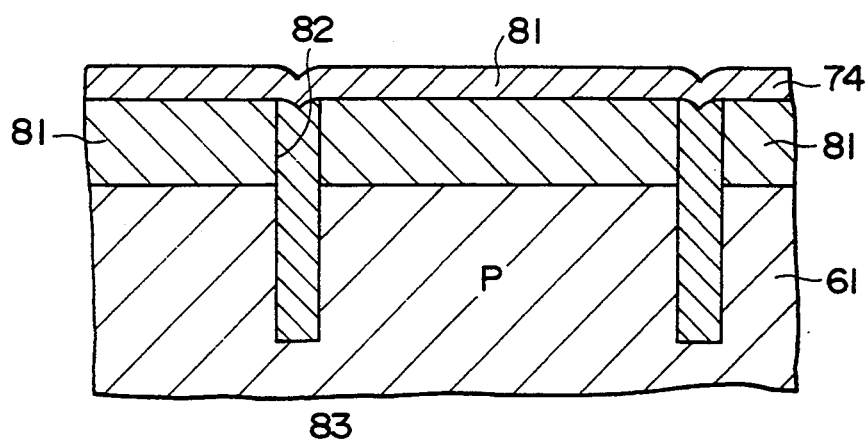

In the next step, as shown in FIG. 13B, the recesses 82 are filled with a polycrystal silicon film 83 deposited by the chemical vapor deposition (CVD). In this case, a certain amount of phosphorus is added to be contained in the polycrystal silicon film 83 at the time of executing the chemical vapor deposition. And bit lines 74 connected to the polycrystal silicon film 83 are formed of a polyside films.

Figure 13C:
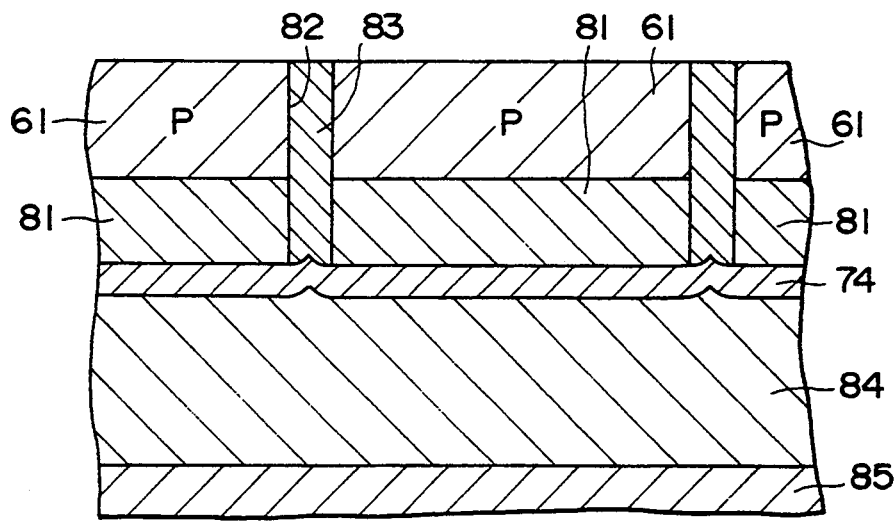

Thereafter, as shown in FIG. 13C, a silicon dioxide film 84 is deposited by the decompressed CVD or the like to flatten the irregularities of the bit lines 74, and then a quartz substrate 85 (FIG. 13C) is bonded with an adhesive agent or the like to the silicon dioxide film 84. The quartz substrate 85 may be replaced with a silicon substrate or the like.

Subsequently, as shown in FIG. 13C, the silicon substrate 61 and so forth are inverted so that the reverse side of the silicon substrate 61 in the preceding process step of FIG. 13B is turned to be obverse. Then the obverse surface is polished to decrease the thickness of the silicon substrate 61 to 1 micron or so, thereby exposing the polycrystal silicon film 83.

Figure 13D:
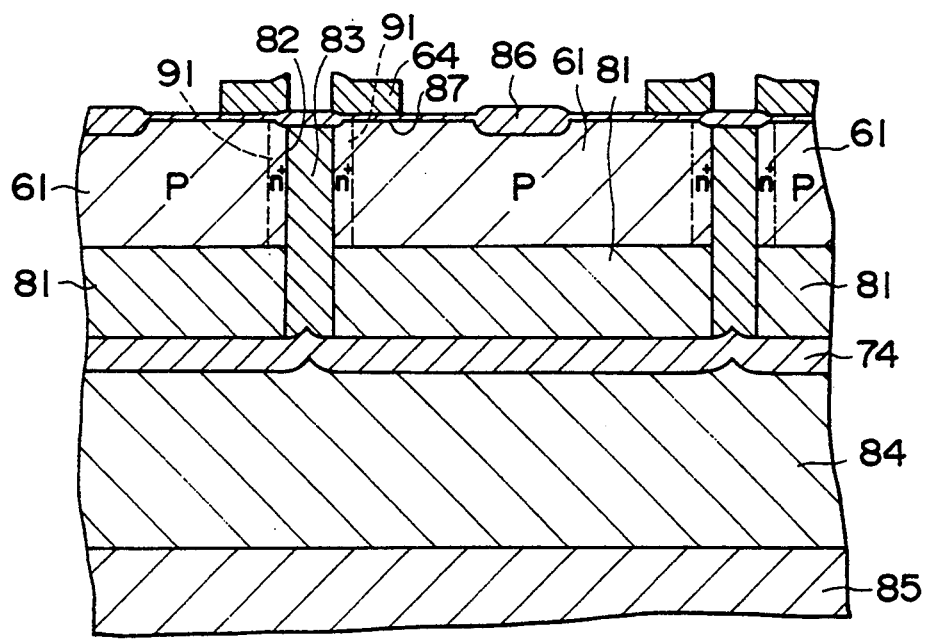

In the next step, as shown in FIG. 13D, an element isolating film 86 of silicon dioxide and a gate insulating film 87 of silicon dioxide are formed on the polished surface of the silicon substrate 61.

In forming the silicon dioxide film 87, the polycrystal silicon is oxidized more readily than monocrystal silicon, and the polycrystal silicon film 83 doped with phosphorus can be oxidized further readily, so that the silicon dioxide film 87 on the polycrystal silicon film 83 is rendered thicker than any other portion.

During the heat treatment executed to form the silicon dioxide films 86 and 87, the phosphorus contained in the polycrystal silicon film 83 is diffused in a solid phase into the silicon substrate 61, so that an $n^+$ diffused layer 91 is formed in the periphery of the polycrystal silicon film 83.

Thereafter a polycrystal silicon film is deposited on the silicon dioxide films 87 and 86, and then the polycrystal silicon film is patterned to form word lines 64.

The recesses 82 may be formed on the polished side of the silicon substrate 61 after inverting the silicon substrate 61 as shown in FIG. 13C and polishing the surface thereof.

However, if the recesses 82 are formed before polishing the silicon substrate 61 as in this embodiment, the recesses 82 are usable as a reference for positioning the silicon dioxide film 86 and the word lines 64, hence facilitating the mutual positional arrangement of the word lines 64 and the bit lines 74.

Figure 13E:
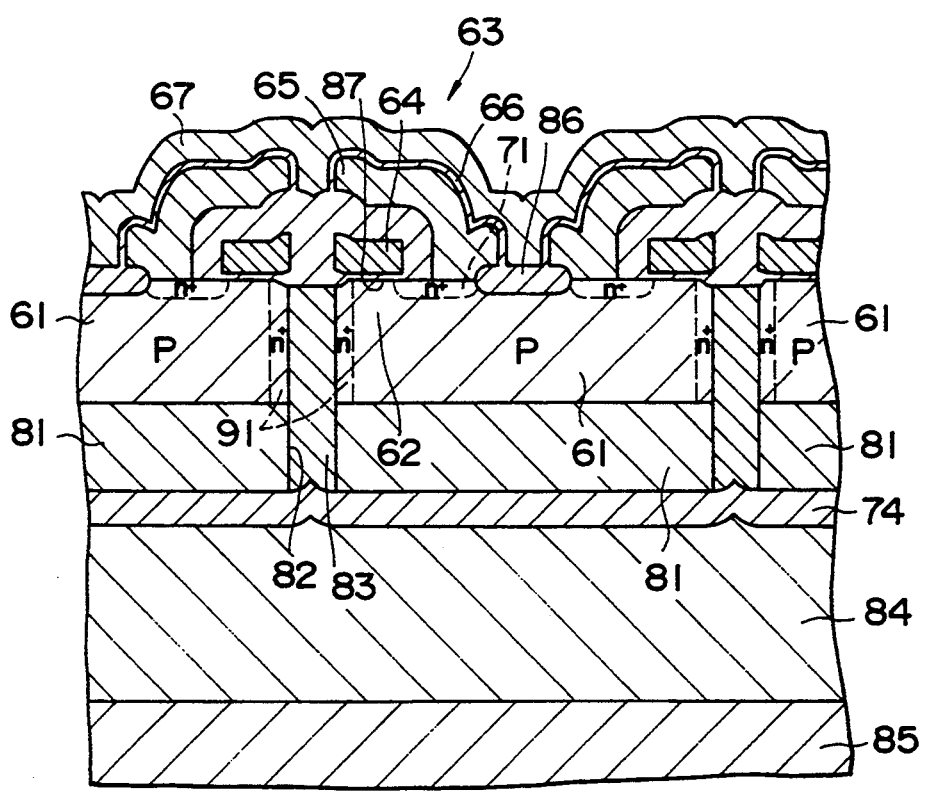

Subsequently, as shown in FIG. 13E, an $n^+$ diffused layer 71 is formed to complete a transistor 62, and then a storage node 65, a capacitor insulating film 66 and a cell plate 67 are sequentially formed via an interlayer insulating film 92 to thereby complete a capacity element 63.

Figure 13F:
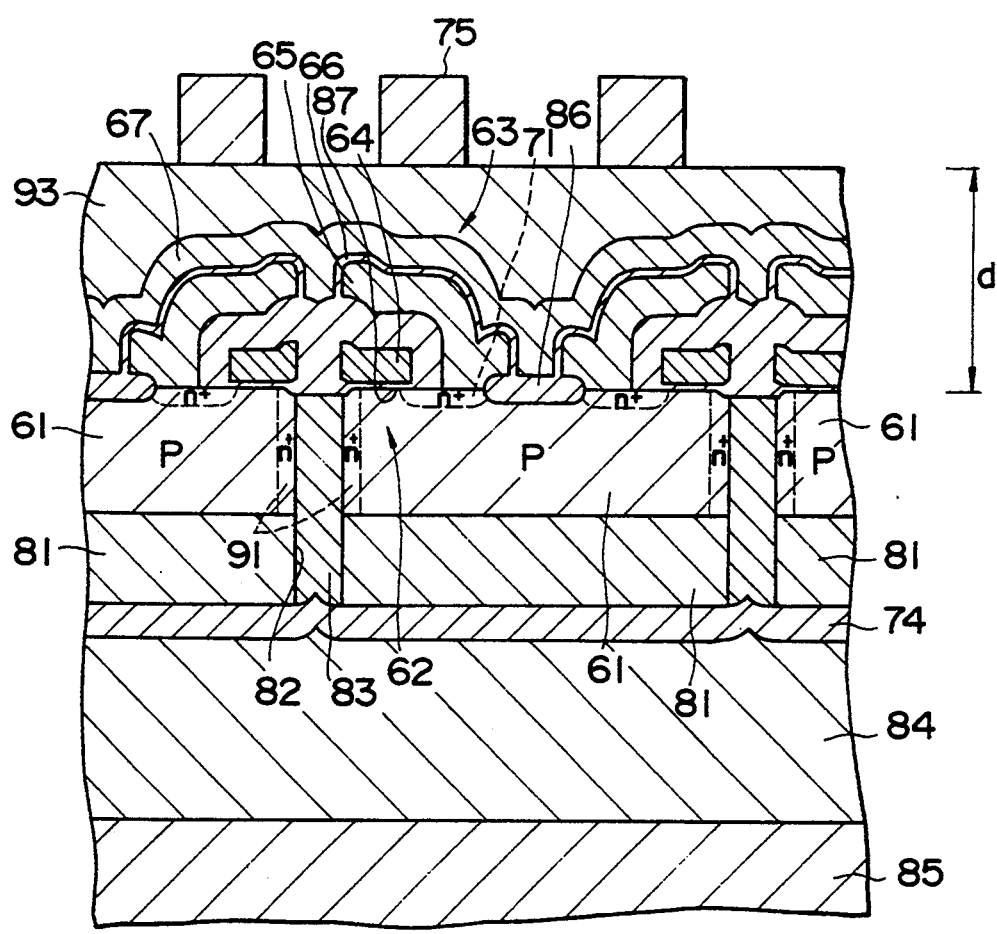

And finally, as shown in FIG. 13F, the irregularity of the cell plate 67 is flattened with the interlayer insulating film 93, and metal wires 75 are formed on the interlayer insulating film 93.

In the embodiment manufactured as mentioned above, the bit lines 74 are formed on the reverse side of the silicon substrate 61 with respect to the transistor 62 and the capacity element 63. Therefore the distance between the metal wire 75 and the silicon substrate 61 in this embodiment is smaller than that in the conventional example.

And due to the existence of the thick silicon dioxide film 81 between the bit line 74 and the silicon substrate 61, it is possible to reduce the interference noise and the parasitic capacitance between the bit line 74 and the silicon substrate 61.

Since the silicon dioxide film 81 is thick, the recesses 82 are formed deep. However, the current flowing in the bit line 74 is originally so small, and the irregularity covering facility of the polycrystal silicon film 83 is superior to that of the metal wire 75 with another advantage that the resistance of the polycrystal silicon film 83 is rendered low due to the phosphorus contained therein. Consequently no problem arises from the great depth of the recesses 82.

It is to be understood that the above embodiment represents merely an exemplary case of applying the present invention to a stacked capacity type DRAM of an open bit line structure, and the present invention is applicable also to another stacked capacity type DRAM or the like of a folded bit line structure.

What is claimed is:

1. A method for forming a dynamic random access memory comprising the steps of:
   a) oxidizing one surface of a silicon first substrate (61) to form a silicon dioxide film (81),
   b) forming recesses (82) in said silicon dioxide film (81) and into said first substrate (61),
   c) fill said recesses with polysilicon plugs containing phosphorous (83),
   d) form bit lines (74) on said silicon dioxide film (81) and said polysilicon (83),
   e) deposit a second silicon dioxide film (84) on said bit lines (74),
   f) bond a second substrate (85) with an adhesive adjacent to said second silicon dioxide film (84),
   g) remove by polishing an opposite surface of said first substrate (61) until said first substrate (61) has a thickness of only a few microns,
   h) form an isolating film (86) of silicon dioxide and a gate insulating film (87) on the polished opposite surface of said first substrate (61),
   i) heat treating so that the phosphorous in said plugs (83) is diffused into adjacent regions of said first substrate (61) to form diffused layers (91),
   j) deposit polycrystal film on films (86) and (87) to form word lines (64),
   k) form an n+ diffused region (71) in said first substrate (61) for a transistor (62),
   l) form a storage node (65) which extends from said diffused region (71),
   m) form a capacitor insulating film (66) over said storage node (65),
   n) form a cell plate (67) over said capacitor insulating film (66),
   o) form another insulating film (93) over said cell plate (67), and
   p) form parallel spaced metal conductors (75) on said another insulating film (93).

2. The method of claim 1 for forming a dynamic random access memory wherein a surface of said another insulating film (93) which does not engage said cell plate (67) is flat.

* * * * *